US009088319B2

(12) United States Patent
Peng et al.

(10) Patent No.: US 9,088,319 B2
(45) Date of Patent: Jul. 21, 2015

(54) RF TRANSMITTER ARCHITECTURE, INTEGRATED CIRCUIT DEVICE, WIRELESS COMMUNICATION UNIT AND METHOD THEREFOR

(75) Inventors: Chun-Hsien Peng, Nantou County (TW); Julia Liu, San Jose, CA (US); Chao Lu, Fremont, CA (US); Hua Wang, San Francisco, CA (US); Paul Cheng Po Liang, Hsinchu County (TW)

(73) Assignee: MediaTek Singapore Pte. Ltd., Singapore (SG)

( * ) Notice: Subject to any disclaimer, the term of this patent is extended or adjusted under 35 U.S.C. 154(b) by 257 days.

(21) Appl. No.: 13/451,570

(22) Filed: Apr. 20, 2012

(65) Prior Publication Data

US 2012/0269293 A1     Oct. 25, 2012

Related U.S. Application Data

(63) Continuation-in-part of application No. 13/351,209, filed on Jan. 16, 2012, which is a continuation-in-part of application No. 13/298,282, filed on Nov. 16, 2011.

(60) Provisional application No. 61/477,684, filed on Apr. 21, 2011, provisional application No. 61/500,900, filed on Jun. 24, 2011, provisional application No. 61/534,710, filed on Sep. 14, 2011.

(51) Int. Cl.
*H04K 1/02* (2006.01)
*H04L 25/03* (2006.01)
(Continued)

(52) U.S. Cl.
CPC ............ *H04B 1/0475* (2013.01); *H03F 1/3247* (2013.01); *H03F 1/3294* (2013.01);
(Continued)

(58) Field of Classification Search
CPC ..... H03F 220/336; H03F 3/24; H03F 1/3247; H03F 1/3241; H04B 1/0475; H03C 5/00; H04L 27/368; H03G 3/3042
USPC ................................................ 375/295–297
See application file for complete search history.

(56) References Cited

U.S. PATENT DOCUMENTS 5,105,445 A    4/1992   Karam
6,298,097 B1   10/2001  Shalom
(Continued)

FOREIGN PATENT DOCUMENTS

CN    1784879 A    6/2006
CN    1819471 A    8/2006
(Continued)

OTHER PUBLICATIONS

"International Search Report" mailed on May 17, 2012 for International application No. PCT/CN2012/071661, International filing date:Feb. 27, 2012.
(Continued)

*Primary Examiner* — Sam K Ahn
*Assistant Examiner* — James M Perez
(74) *Attorney, Agent, or Firm* — Winston Hsu; Scott Margo (57) ABSTRACT

A radio frequency (RF) transmitter architecture includes at least one digital signal processing module. The at least one digital signal processing module is configurable to operate in at least a first mode wherein the at least one digital signal processing module is arranged to receive a digital input signal, select, from a reduced set of digital power amplifier (DPA) control values, a plurality of DPA control values based at least partly on the received digital input signal, perform interpolation of the plurality of selected DPA control values to determine a DPA control value from a non-reduced set of DPA control values representative of the received digital input signal, and output to at least one DPA component the determined DPA control value representative of the received digital input signal.

11 Claims, 9 Drawing Sheets

(51) Int. Cl.
*H04L 25/49* (2006.01)
*H04B 1/04* (2006.01)
*H04L 27/36* (2006.01)
*H03F 1/32* (2006.01)
*H03F 3/217* (2006.01)
*H03F 3/24* (2006.01)
*H03F 3/45* (2006.01)

(52) U.S. Cl.
CPC .............. *H03F3/2171* (2013.01); *H03F 3/245* (2013.01); *H03F 3/45179* (2013.01); *H04L 27/368* (2013.01); *H03F 2200/336* (2013.01); *H03F 2201/3233* (2013.01); *H04B 2001/0425* (2013.01)

(56) References Cited

U.S. PATENT DOCUMENTS

| | | | |
|---|---|---|---|
| 6,697,436 B1* | 2/2004 | Wright et al. | 375/296 |
| 6,937,175 B1 | 8/2005 | Cruz-Albrecht | |
| 7,158,582 B2 | 1/2007 | Gamm | |
| 7,382,835 B2 | 6/2008 | Anvari | |
| 7,724,839 B2 | 5/2010 | Chen | |
| 7,826,553 B2 | 11/2010 | Chen | |
| 7,889,811 B2 | 2/2011 | Byun | |
| 2001/0050592 A1 | 12/2001 | Wright | |
| 2002/0085647 A1* | 7/2002 | Oishi et al. | 375/297 |
| 2003/0035494 A1 | 2/2003 | Bauder | |
| 2003/0179830 A1 | 9/2003 | Eidson | |
| 2004/0124916 A1 | 7/2004 | Kontson | |
| 2005/0195030 A1 | 9/2005 | Okazaki | |
| 2006/0119493 A1 | 6/2006 | Tal | |
| 2006/0291589 A1 | 12/2006 | Eliezer | |
| 2007/0049219 A1 | 3/2007 | Demir | |
| 2007/0190952 A1 | 8/2007 | Waheed | |
| 2008/0002788 A1 | 1/2008 | Akhtar | |
| 2008/0075194 A1 | 3/2008 | Ravi | |
| 2008/0187035 A1 | 8/2008 | Nakamura | |
| 2009/0004981 A1 | 1/2009 | Eliezer | |
| 2009/0051426 A1 | 2/2009 | Ba | |
| 2009/0054016 A1 | 2/2009 | Waheed | |
| 2009/0225903 A1 | 9/2009 | Van Waasen | |
| 2010/0073084 A1 | 3/2010 | Hur | |
| 2010/0074367 A1 | 3/2010 | Kim | |
| 2010/0090745 A1 | 4/2010 | Kousai | |
| 2010/0105338 A1 | 4/2010 | Wang | |
| 2010/0127780 A1 | 5/2010 | An | |
| 2011/0058622 A1 | 3/2011 | Liang | |
| 2011/0080216 A1 | 4/2011 | Mujica | |
| 2011/0103508 A1* | 5/2011 | Mu et al. | 375/295 |
| 2011/0129037 A1 | 6/2011 | Staszewski | |
| 2011/0176636 A1 | 7/2011 | Wang | |
| 2011/0260797 A1 | 10/2011 | Lee | |

FOREIGN PATENT DOCUMENTS

| | | |
|---|---|---|
| CN | 101478514 A | 7/2009 |
| JP | 200749621 A | 2/2007 |
| WO | 0025495 A1 | 5/2000 |
| WO | 0069065 A2 | 11/2000 |

OTHER PUBLICATIONS

"International Search Report" mailed on Jul. 5, 2012 for International application No. PCT/CN2012/073413, International filing date:Mar. 31, 2012.

"International Search Report" mailed on Oct. 4, 2012 for International application No. PCT/CN2012/077358, International filing date: Jun. 21, 2012.

Robert Bogdan Staszewski et al., All-Digital PLL and Transmitter for Mobile Phones, IEEE Journal of Solid-State Circuits, vol. 40, No. 12, Dec. 2005.

Mohammad. E. Heidari et al., All-digital out-phasing modulator for a software-defined transmitter, 2008.

Debopriyo Chowdhury et al., A 2.4GHz mixed-signal polar power amplifier with low-power integrated filtering in 65nm CMOS, 2010.

Calogero D. Presti et al., A 25 dBm digitally modulated CMOS power amplifier for WCDMA/EDGE/OFDM with adaptive digital predistortion and efficient power control, 2009.

Petri Eloranta et al., A multimode transmitter in 0.13 um CMOS using direct-digital RF modulator, IEEE Journal of Solid-State Circuits, vol. 42, No. 12, Dec. 2007.

Jaimin Mehta et al., A 0.8mm2 All-Digital SAW-Less Polar Transmitter in 65nm EDGE SoC, ISSCC, p. 58-59, Figure 3.2.7, 2010.

Edward Gebara et al., Integrated CMOS PA Technology for Cellular Digital Radios, Feb. 18, 2009.

Hyun H. Boo et al., Adaptive Predistortion Using a Delta-Sigma Modulator for Automatic Inversion of Power Amplifier Nonlinearity, 2009.

Cavers, A Linearizing Predistorter With Fast Adaptation, pp. 41-47, 1990 IEEE.

Besbes, A Fast Adaptive Predistorter for Nonlinearly Amplified M-QAM Signals, pp. 108-112, 2000 IEEE.

Cruise et al., "A Digital-to-RF-Amplitude Converter for GSM/GPRS/EDGE in 90-nm Digital CMOS", Jun. 2005, pp. 21-24, Radio Frequency integrated Circuits (RFIC) Symposium, IEEE.

Morteza S. Alavi, Akshay Visweswaran, Robert B. Staszewski, Leo C.N. de Vreede, John R. Long, Atef Akhnoukh, "A 2-GHz Digital I/Q Modulator in 65-nm CMOS", Delft University of Technology, The Netherlands, IEEE Asian Solid-State Circuits Conference, Nov. 14-16, 2011, Jeju, Korea, 2011 IEEE, p. 277-280.

Hsin-Hung Chen, Chih-Hung Lin, Po-Chiun Huang, and Jiunn-Tsair Chen, "Joint Polynomial and Look-Up-Table Predistortion Power Amplifier Linearization", National Tsing Hua University, Taiwan, IEEE Transactions on circuits and systems_II: Express briefs, vol. 53, No. 8, Aug. 2006, 2006 IEEE, p. 612-616.

Morteza S. Alavi, Robert Bogdan Staszewski, Leo C. N. de Vreede, Akshay Visweswaran, and John R. Long, "All-Digital RF I/Q Modulator", Delft University of Technology, The Netherlands, IEEE Transactions on microwave theory and techniques, vol. 60, No. 11, Nov. 2012, 2012 IEEE, p. 3513-3526.

* cited by examiner

RF TRANSMITTER ARCHITECTURE, INTEGRATED CIRCUIT DEVICE, WIRELESS COMMUNICATION UNIT AND METHOD THEREFOR

CROSS-REFERENCE TO RELATED APPLICATIONS

This application claims the benefit of U.S. provisional application No. 61/477,684 (which was filed on Apr. 21, 2011), U.S. provisional application No. 61/500,900 (which was filed on Jun. 24, 2011), U.S. provisional application No. 61/534,710 (which was filed on Sep. 14, 2011). This application is also a continuation-in-part of prior non-provisional application Ser. No. 13/351,209, filed on Jan. 16, 2012, which is a continuation-in-part of U.S. non-provisional application Ser. No. 13/298,282, filed on Nov. 16, 2011. The entire contents of these related applications are incorporated herein by reference.

BACKGROUND OF THE INVENTION

The field of this invention relates to a radio frequency (RF) transmitter architecture, an integrated circuit device, a wireless communication unit and a method therefor. The invention is applicable to, but not limited to, a method and apparatus for performing digital pre-distortion of a signal for transmission over an RF interface.

Advances in the deep sub-micron CMOS (Complimentary Metal-Oxide Semiconductor) process have led to digital circuits becoming smaller and more power efficient. However, analogue circuits do not scale well with the deep sub-micron CMOS process. It is therefore desirable for devices such as radio frequency (RF) transmitters to remove as many analogue components as possible with the assistance of digital signal processing algorithms.

Conventional RF transmitters use linear power amplifiers (PAs). Accordingly, the power efficiency of such conventional RF transmitters is usually very low due to the low efficiency of the linear PAs used therein. Switch-mode PAs have very high efficiency in comparison, which make such switch-mode PAs an attractive alternative to conventional linear PAs within RF transmitters.

Thus, an RF transmitter that can utilize switch-mode PAs through the assistance of digital processing algorithms to reduce the size and improve power efficiency is highly desirable. However, switch-mode PAs normally exhibit a highly non-linear input-output relationship due to, for example, load interactions between the I-path and Q-path of PAs in an in-phase/quadrature (IQ) transmitter architecture. Accordingly, switch-mode PA architectures require non-linear compensation. In addition to such non-linear compensation of PAs, such IQ transmitter designs are also required to compensate for imbalance between the I and Q paths due to, for example, local oscillator (LO) mismatch as well as I-section PA and Q-section PA mismatch.

Digital polar transmitters are another type of known transmitter design that also achieves high efficiency by operating the PAs in compressed mode. A problem with digital polar transmitter designs is that, due to the inherent bandwidth expansion characteristics of converting IQ signals into amplitude modulation (AM) and phase modulation (PM) in a polar architecture, they are only suitable for narrowband modulated signals.

To accommodate a need for increasingly higher throughput on the go, some wireless standards such as WCDMA (wideband code division multiple access), LTE (Long Term Evolution), IEEE 802.11 for WLANs (wireless local area networks), etc., have been proposed to support modulation signals with peak-to-average power ratio (PAPR) and bandwidth from 5 MHz to 20 MHz, or to even wider bandwidths, such as 160 MHz in IEEE 802.11ac. It is therefore also desirable to have a common transmitter architecture that can support multi-mode and multi-bandwidth operation while simultaneously achieving low current consumption and small form factors.

Thus, a need exists for an improved RF transmitter architecture, and method of performing digital pre-distortion and digital compensation technology of a signal for transmission over an RF interface.

SUMMARY OF THE INVENTION

Accordingly, the invention seeks to mitigate, alleviate or eliminate one or more of the above mentioned disadvantages singly or in any combination. Aspects of the invention provide a method performing digital pre-distortion of a signal for transmission over a radio frequency (RF) interface.

According to a first aspect of the invention, there is provided an RF transmitter architecture comprising at least one digital signal processing module. The at least one digital signal processing module is configurable to operate in at least a first mode wherein the at least one digital signal processing module is arranged to receive a digital input signal, select, from a reduced set of digital power amplifier (DPA) control values, a plurality of DPA control values based at least partly on the received digital input signal, perform interpolation of the plurality of selected DPA control values to determine a DPA control value from a non-reduced set of DPA control values representative of the received digital input signal, and output to at least one DPA component the determined DPA control value representative of the received digital input signal.

Thus, in this manner, by appropriately mapping data points within a pre-distortion profile for the DPA component to DPA control values for the DPA module, pre-distortion may be applied to the received digital input signal that substantially compensates for each RF impairment (e.g. PA non-linearities, IQ imbalance, etc.) present within that particular RF architecture in a single, pre-distortion stage. In this manner, pre-distortion functionality may be simplified and performed more efficiently and at relatively high speeds. Furthermore, because the received digital input signal is used to select DPA control values from a reduced set of DPA control values, only the reduced set of DPA control values are required to be calibrated in order to perform training of the pre-distortion functionality across the full pre-distortion profile for the DPA component. Accordingly, the amount of time required to perform such calibration may be significantly reduced compared to the time required to calibrate the full, non-reduced set of DPA control values. Furthermore, by performing interpolation of the selected DPA control values in order to determine a DPA control value from the non-reduced set of DPA control values representative of the received digital input signal, the level of precision with which the DPA component may be controlled is substantially maintained.

According to an optional feature of the invention, the at least one digital signal processing module may be arranged to, when operating in the first mode, identify, from within a set of DPA profile data points to which the reduced set of DPA control values have been mapped, a plurality of data points closest to the received digital input signal, and select a plurality of DPA control values mapped to the identified data points with which to perform interpolation. For example, the at least one digital signal processing module may be arranged to retrieve the DPA control values mapped to the identified data points from within a lookup table.

According to an optional feature of the invention, the digital input signal may comprise a two-dimensional signal, for example such as an in-phase/quadrature (I/Q) signal, and the at least one digital signal processing module may be arranged to, when operating in the first mode, identify, from within a set of data points for a two-dimensional data profile to which the reduced set of DPA control values have been mapped, a two-dimensional cluster of data points closest to the received digital input signal, and select a plurality of DPA control values mapped to the identified data points with which to perform interpolation.

According to an optional feature of the invention, the received digital control signal may comprise an up-sampled baseband signal.

According to an optional feature of the invention, the at least one digital signal processing module may be arranged to perform digital pre-distortion of the received digital input signal, when operating in the first mode. For example, the at least one digital signal processing module may be arranged to, when operating in the first mode, perform digital pre-distortion of the received digital input signal to compensate for at least one from a group comprising of at least one of: DPA non-linearity; in-phase/quadrature path imbalance; and DPA memory effect.

According to an optional feature of the invention, the at least one digital signal processing module may be configurable to operate in at least one further mode in which the at least one digital signal processing module is arranged to receive a digital reference signal, output to the at least one DPA component a DPA control value representative of the received digital reference signal, receive a feedback signal from an output of the at least one DPA component, and perform calibration thereof based at least partly on the received feedback signal.

According to an optional feature of the invention, the at least one digital signal processing module may be arranged to, when operating in the at least one further mode, output to the at least one DPA component a DPA control value from the reduced set of DPA control values representative of the received digital reference signal.

According to an optional feature of the invention, the at least one digital signal processing module may be arranged to, when operating in the at least one further mode, receive a digital reference signal comprising a value representative of a data point to which a DPA control value within the reduced set of DPA control values is mapped, and output to the at least one DPA component the DPA control value mapped thereto.

According to an optional feature of the invention, the at least one digital signal processing module may be arranged to perform calibration thereof by updating at least one DPA control value from the reduced set of DPA control values based at least partly on the received feedback signal.

According to an optional feature of the invention, the at least one digital signal processing module may be arranged to, when operating in the at least one further mode, update the DPA control value mapped to the data point, of which the received digital reference signal is representative, to converge a value of the received feedback signal with a value of the received digital reference signal.

According to an optional feature of the invention, the at least one digital signal processing module may be arranged to, when operating in the at least one further mode, perform a comparison of the digital reference signal and the feedback signal, and update the at least one DPA control value from the reduced set of DPA control values based at least partly on said comparison.

According to a second aspect of the invention, there is provided an integrated circuit device comprising at least one signal processing module. The at least one digital signal processing module is configurable to operate in at least a first mode wherein the at least one digital signal processing module is arranged to receive a digital reference signal, select, from a reduced set of DPA control values, a plurality of DPA control values based at least partly on the received digital reference signal, perform interpolation of the plurality of selected DPA control values to determine a DPA control value from a non-reduced set of DPA control values representative of the received digital reference signal, and output to at least one DPA component the determined DPA control value representative of the received digital reference signal.

According to an optional feature of the invention, the at least one digital signal processing module may be configurable to operate in at least one further mode in which the at least one digital signal processing module is arranged to receive a digital reference signal, output to the at least one DPA component a DPA control value representative of the received digital reference signal, receive a feedback signal from an output of the at least one DPA component, and perform calibration thereof based at least partly on the received feedback signal.

According to a third aspect of the invention, there is provided a wireless communication unit comprising the RF transmitter architecture of the first aspect of the invention.

According to a fourth aspect of the invention, there is provided a method of performing digital pre-distortion of a signal for transmission over an RF interface. The method comprises, in a first mode of operation, receiving a digital input signal, selecting, from a reduced set of DPA control values, a plurality of DPA control values based at least partly on the received digital input signal, performing interpolation of the plurality of selected DPA control values to determine a DPA control value from a non-reduced set of DPA control values representative of the received digital input signal, and outputting to at least one DPA component the determined DPA control value representative of the received digital input signal.

According to an optional feature of the invention, the method may further comprise, in at least one further mode of operation, receiving a digital reference signal, outputting to the at least one DPA component a DPA control value representative of the received digital reference signal, receiving a feedback signal from an output of the at least one DPA component, and performing calibration thereof based at least partly on the received feedback signal.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Like reference numerals have been included in the respective drawings to ease understanding.

DETAILED DESCRIPTION

The present invention will now be described with reference to an example of a radio frequency (RF) transmitter architecture for use within, say, a wireless telecommunication handset and adapted in accordance with some embodiments of the present invention. However, it will be appreciated that the inventive concept described herein is not limited to specific features of the illustrated example, and may equally be implemented within alternative applications.

Figure 1:
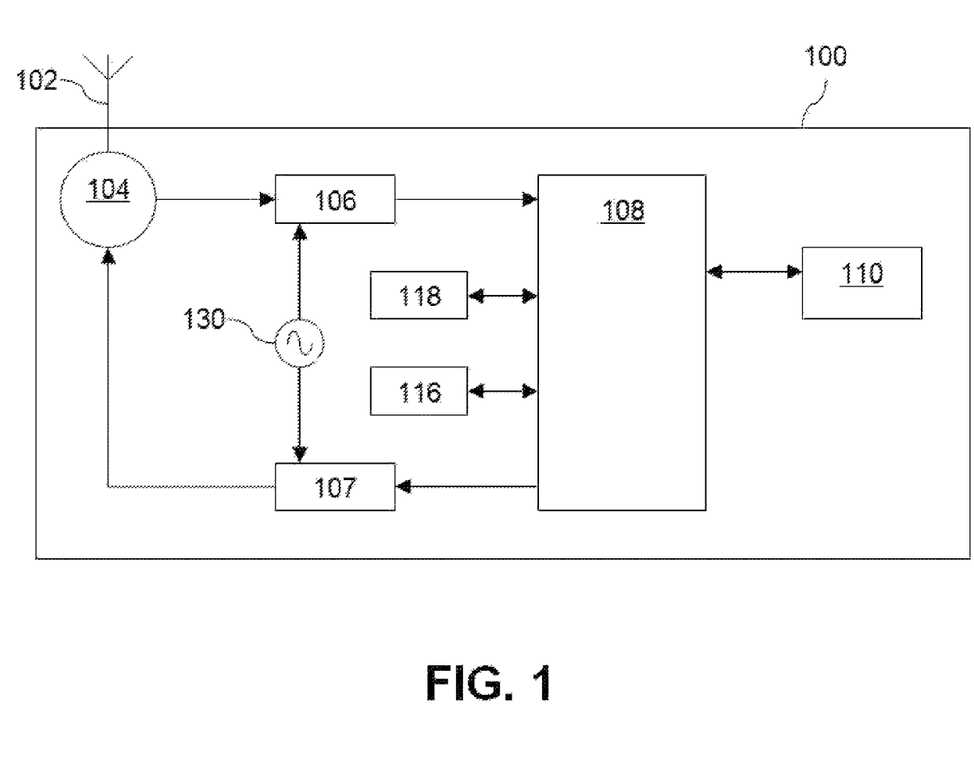
FIG. 1 illustrates an example of a simplified block diagram of part of an electronic device.

Referring first to FIG. 1, there is illustrated an example of a simplified block diagram of part of an electronic device 100 adapted to support the inventive concept of an example of the present invention. The electronic device 100, in the context of the illustrated embodiment of the invention, is a wireless telecommunication handset. As such, the electronic device 100 comprises an antenna 102 and contains a variety of well known RF transceiver components or circuits operably coupled to the antenna 102. In particular for the illustrated example, the antenna 102 is operably coupled to a duplex filter/antenna switch 104 that provides isolation between a receiver chain 106 and a transmitter chain 107. As is known in the art, the receiver chain 106 typically includes RF receiver circuitry for providing reception, filtering and intermediate or base-band frequency conversion. Conversely, the transmitter chain 107 typically includes RF transmitter circuitry for providing modulation and power amplification. Each of the receiver chain 106 and transmitter chain 107 operates according to oscillation signals generated from an oscillator 130.

For completeness, the electronic device 100 further comprises signal processing logic 108. An output from the signal processing logic 108 may be provided to a suitable user interface (UI) 110 comprising, for example, a display, keypad, microphone, speaker etc. The signal processing logic 108 may also be coupled to a memory element 116 that stores operating regimes, such as decoding/encoding functions and the like and may be realised in a variety of technologies such as random access memory (RAM) (volatile), (non-volatile) read only memory (ROM), Flash memory or any combination of these or other memory technologies. A timer 118 is typically coupled to the signal processing logic 108 to control the timing of operations within the electronic device 100.

As is well known in the art, the transmitter chain 107 of such a wireless telecommunication handset comprises transmitter circuitry arranged to receive an input signal, for example from, in the illustrated example, the signal processing logic 108; the input signal comprising information to be transmitted over an RF interface. The transmitter chain 107 is further arranged to output an RF signal comprising the information to be transmitted to, in the illustrated example, the antenna 102 via the duplex filter/antenna switch 104. As such, the transmitter chain 107 is typically required to perform digital to analogue conversion, mixing, noise shaping and amplification of the input signal in order to generate the RF signal output thereby.

Figure 2:
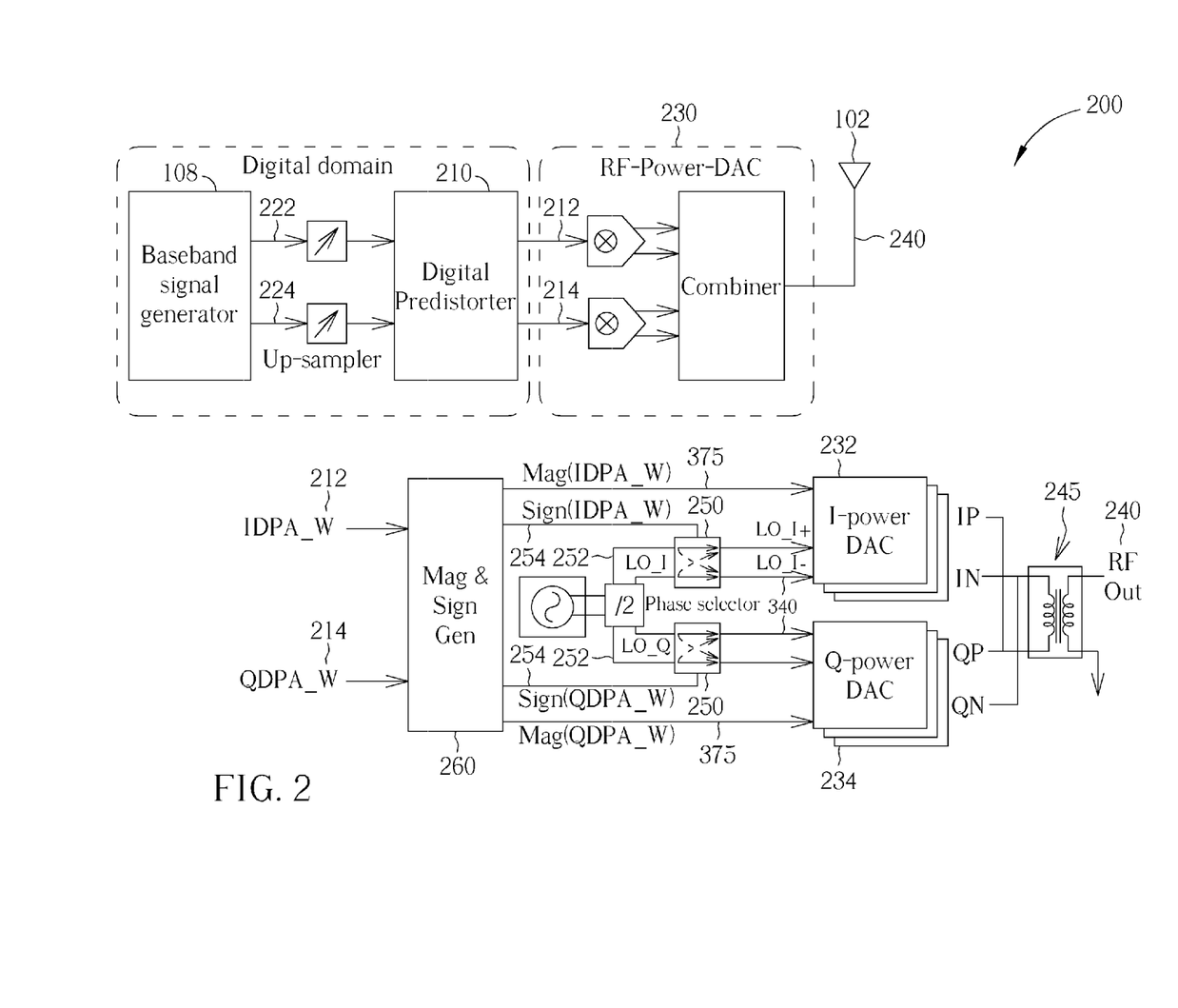
FIG. 2 illustrates an example of a radio frequency (RF) transmitter architecture.

Referring now to FIG. 2, there is illustrated an example of an RF transmitter architecture 200, adapted in accordance with some example embodiments of the present invention, such as may be implemented within the transmitter chain 107 of FIG. 1. The RF transmitter architecture 200 of FIG. 2 comprises a digital signal processing (digital predistortion) module (denoted as "Digital Predistorter" in FIG. 2) 210 arranged to receive one or more digital input signals comprising information to be transmitted over an RF interface, for example via antenna 102. In the illustrated example, the digital signal processing module 210 is arranged to receive from a digital baseband component, such as the signal processing logic (denoted as "Baseband Signal Generator" in FIG. 2) 108 of FIG. 1, an IQ (In-phase/Quadrature) input signal comprising a first (In-phase) signal component 222 and a second (Quadrature) signal component 224. The digital signal processing module 210 is further arranged to perform mapping of the received complex input signal(s) 222, 224 to a first dimension digital control word (e.g. in-phase control word 212) and a second dimension digital control word (e.g. quadrature control word 214), and to output the first dimension and second dimension digital control words 212, 214 to digital power amplifier (DPA) module 230, called RF-Power-DAC as shown in FIG. 2. In the illustrated example, the signal received by the digital signal processing module 210 comprises an up-sampled version of the IQ signal. In this manner, the signal received by the digital signal processing module 210 may be up-sampled to increase the sample rate thereof to an input data rate of the DPA module 230.

In the illustrated example, the DPA module 230 comprises a first (in-phase) array of switch-mode power cells (denoted as "I-power DAC") 232 and a second (quadrature) array of switch-mode power cells (denoted as "Q-power DAC") 234. The DPA module 230 is arranged to receive the digital control words 212, 214 (also denoted as "IDPA_W" and "QDPA_W") output by the digital signal processing module 210, and to generate an analogue RF signal (i.e., RF Out) 240 for transmission over an RF interface, for example via antenna 102, based at least partly on the received (in-phase and quadrature) digital control words 212, 214.

In this manner, the RF transmitter architecture 200 comprises a complex signal based architecture, for example an IQ based architecture, and as such is suitable for both narrowband and wideband modulation input signals. This is in contrast to, for example, a digital polar architecture which is only suitable for narrowband modulated signals due to the inherent bandwidth expansion characteristics of converting IQ signals into amplitude modulation (AM) and phase modulation (PM). In addition, the RF transmitter architecture 200 extends the digital domain through to the DPA module 230, thereby benefiting from the scalability and efficiency of digital components to a greater extent than conventional (linear) PA architectures. Furthermore, the RF transmitter architecture 200 illustrated in FIG. 2 takes advantage of the efficiency of switch-mode power cells.

For completeness, the first array of switch-mode power cells 232 is arranged to receive at least a part of the first (e.g. in-phase) digital control word 212 and to generate a first (e.g. in-phase) component of the analogue RF signal 240 based at least partly on the received digital control word 212. Conversely, the second array of switch-mode power cells 234 is arranged to receive at least a part of the second (e.g. quadrature) digital control word 214 and to generate a second (e.g. quadrature) component of the analogue RF signal 240 based at least partly on the received digital control word 214. The separate components are subsequently combined, at 245, to generate the complex analogue RF signal 240.

In this manner, by providing multiple switch-mode power cell arrays 232, 234 arranged to receive separately the digital control words 212, 214 for the respective components of a multi-dimensional, e.g. complex (IQ), signal, and to separately generate the amplified components therefor (which may then be subsequently combined), a DPA module 230 is achieved that is capable of being digitally controlled to generate a multi-dimensional (e.g. IQ) amplified signal.

Figure 3:
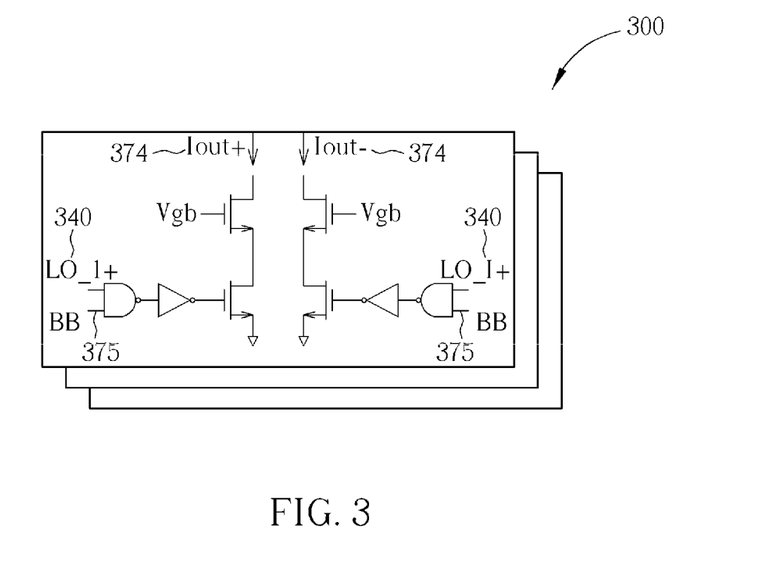
FIG. 3 illustrates an example of a switch-mode power cell.

An example of a switch-mode power cell 300, which in the illustrated example comprises a power cell from the first (in-phase) array 232, is illustrated in FIG. 3, and which for the illustrated example comprises a high efficiency inverse Class D structure. Each of the switch-mode power cells 300 is arranged to receive a respective control bit (BB), illustrated at 375, and to selectively output a current signal ($I_{out}+/I_{out}-$) 374 based on the value of the received control bit 375. The outputs of the switch-mode power cells 300 within each array 232, 234 may be operably coupled together such that the individual power cell output current signals ($I_{out}+/I_{out}-$) 374 are combined to provide the respective component of the analogue RF signal 240. The output current signal ($I_{out}+/I_{out}-$) 374 for the individual switch-mode power cells 300 within each array 232, 234 may be weighted in accordance with the significance of their respective control bits 375. In this manner, the combined output current signal of each array 232, 234 may be representative of the value of the digital control word received thereby.

Advantageously, the DPA module 230 illustrated in FIGS. 2 and 3 enables digital to analogue conversion functionality to be combined with power amplifier functionality, thereby simplifying the RF transmitter design. Furthermore, the provision of separate switch-mode power cell arrays 232, 234 to support the separate I and Q components of the complex IQ input signal enables the DPA module 230 to be suitable for both narrowband and wideband modulation input signals.

The switch-mode power cell arrays 232, 234 of the DPA module 230 illustrated in FIG. 2 are further arranged to receive respective carrier frequency signals (LO_I+/LO_I−) 340 as shown in FIG. 3, and to generate the respective components of the analogue RF signal 240 further based at least partly on the received carrier frequency signals 340. For example, the respective carrier frequency signal 340 may be provided to each individual switch-mode power cell 300, such as illustrated at within the power cell 300 of FIG. 3. In this manner, the DPA module 230 illustrated in FIG. 2 enables mixing functionality to also be combined with the power amplifier functionality and digital to analogue conversion functionality.

For the illustrated example, the DPA module 230 comprises phase selectors 250 arranged to receive carrier frequency signals (LO_I/LO_Q) 252 and sign signal (Sign(IDPA_W)/Sign(QDPA_W)) 254, and to output carrier frequency signals 340 for the switch-mode power cell arrays 232, 234 comprising a polarity based at least partly on the received sign signal 254.

The DPA module 230 of the illustrated example further comprises a magnitude and sign generator module (denoted as "Mag & Sign Gen") 260. The magnitude and sign generator module 260 is arranged to receive the digital control words 212, 214 output by the digital signal processing module 210, and from each of the digital control words 212, 214 generate a magnitude control word (Mag(IDPA_W)/Mag(QDPA_W)), illustrated at 375, comprising a magnitude component of the respective digital control word 212, 214, and a sign signal 254, comprising a sign component of the respective digital control word 212, 214. The magnitude control words 375 are then provided to the respective switch-mode power cell arrays 232, 234, and the sign signals 254 are provided to the respective phase selectors 250. In this manner, the sign and magnitude of the in-phase and quadrature signal components may be separated to facilitate the use of switch-mode power cells.

Advantageously, because the digital domain extends through to the DPA module 230, there is no need for a linear pre-driver amplifier or baseband filter. Furthermore, the use of digitally controlled power cells enables the power consumption of the DPA module 230 to be scalable to substantially instantaneous RF output power.

The output impedance of the DPA module 230 is a function of signal power level (i.e. compression). Accordingly, the effective load for each switch-mode power cell array 232, 234 will comprise a combination of the load present on the output signal 240 and the output impedance of the opposing switch-mode power cell array 232, 234. For example, the effective load for the first (in-phase) power cell array 232 will comprise a combination of the load present on the output signal 240 and the output impedance of the second (quadrature) power cell array 234. Thus, the effective load of the first (in-phase) switch-mode power cell array 232 is a function of the Q-channel power level, and the effective load of the second (quadrature) switch-mode power cell array 234 is a function of the I-channel power level. Accordingly, the non-linear characteristics of the DPA module 230 for the illustrated example are not solely a function of the complex signal power ($|I|^2+|Q|^2$), but are also dependant on the in-phase and quadrature digital control words provided to the DPA module 230.

Figure 4:
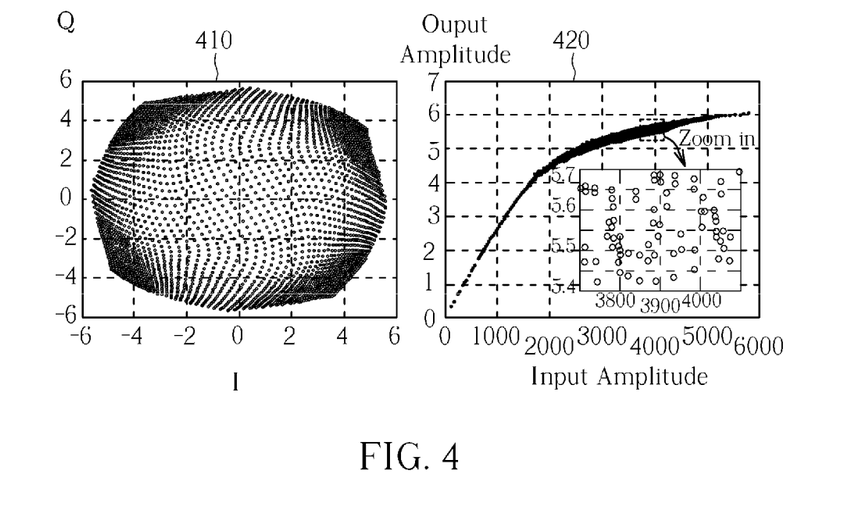
FIG. 4 illustrates an example of a two dimensional non-linear input-output mapping profile for digital power amplifiers.

FIG. 4 illustrates an example of a two dimensional (2D) non-linear input-output mapping profile 410 for the DPA module 230, and a spread AM-AM curve 420 for the DPA module 230. In contrast to a conventional linear amplifier whose non-linearity is usually characterized by the AM-AM and AM-PM distortions, the DPA module 230 of the illustrated example suffers from 2D-non-linearity. This is because the output currents of the I and Q branches are summed at 245 and, for the illustrated example, a 50% duty cycle LO is used for mixing. This non-orthogonal mixing results in load interactions between the I channel power cell array 232 and Q channel power cell array 234. FIG. 4 illustrates the characteristics of the 2D non-linear profile including the output distribution and the spread AM-AM response of the DPA module 230. Accordingly, whilst AM-AM and/or AM-PM correction is typically sufficient for a convention linear power amplifier arrangement with short memory, 2D pre-distortion is required for compensating for the non-linear characteristics of such a DPA module 230.

In addition to the non-linear characteristics identified above, further compensation is required for imbalance between the I and Q components of the DPA module 230 due to, for example, LO (local oscillator) mismatch, I-section PA and Q-section PA mismatch, etc.

Figure 5:
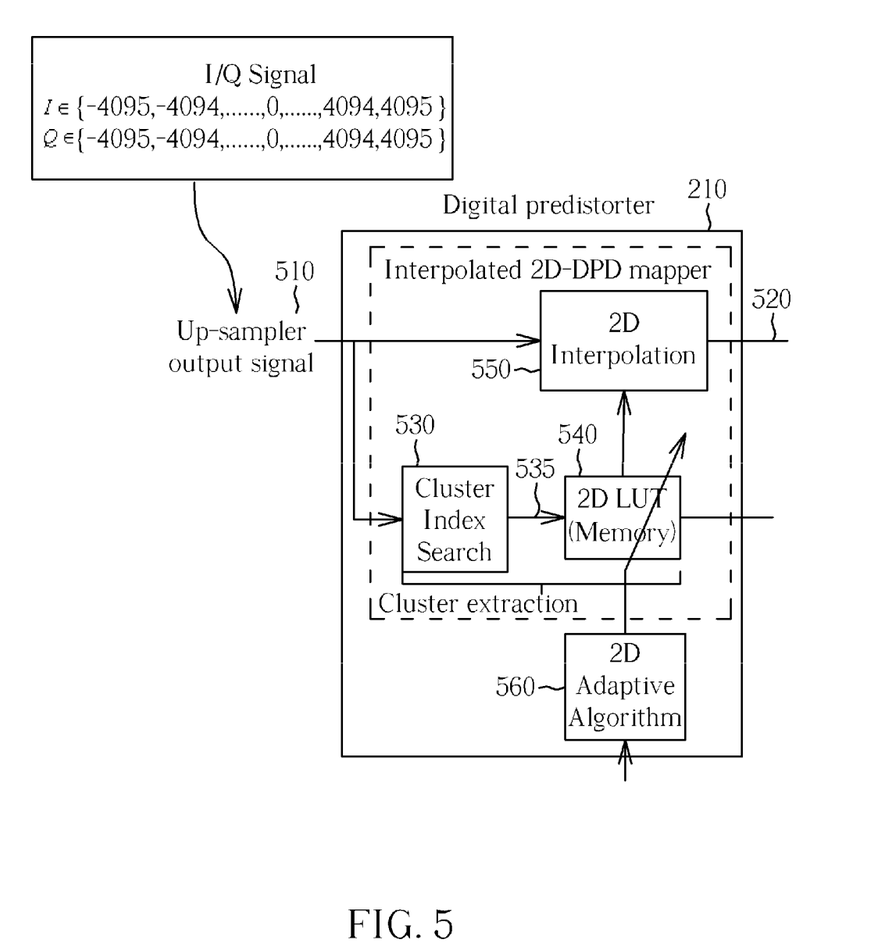
FIGS. 5 and 7 illustrate a simplified block diagram of an example of the digital signal processing module.

Referring now to FIG. 5 there is illustrated a simplified block diagram of an example of the digital signal processing module 210. The digital signal processing module 210 comprises a digital pre-distorter configurable to operate in a first, transmission mode wherein the digital signal processing module 210 is arranged to receive a digital input signal (i.e., up-sampler output signal) 510, perform pre-distortion of the received digital input signal 510, and to output to the DPA module 230 a digital control value representative of the received digital input signal 510. Such digital pre-distortion may be performed using polynomial based techniques or using lookup table (or similar) based techniques. Polynomial based techniques are computationally complex due to the need to derive polynomial coefficients, and thus limit the speed with which such pre-distortion is able to be implemented.

Thus, for the illustrated example, the digital signal processing module 210 is arranged to implement a lookup table (LUT) based technique. In particular, the digital signal processing module 210 is arranged to identify a data point within a 2D pre-distortion profile for the DPA module 230 to which the received digital input signal 510 corresponds, and map (e.g. using an LUT) the identified data point to a digital control value representative of the received digital input signal 510, for example by way of an LUT. In this manner, by appropriately mapping data points within the 2D pre-distortion profile for the DPA module 230 to DPA control values for the DPA module 230, pre-distortion may be applied to the received digital input signal 510 that substantially compensates for each RF impairment (e.g. PA non-linearities, IQ imbalance, etc.) present within that particular RF architecture in a single, pre-distortion stage. In this manner, pre-distortion functionality may be simplified and performed more efficiently and at relatively high speeds.

In the illustrated example, the digital signal processing module 210 is arranged to receive as the digital input signal 510 the up-sampled 2D (IQ) input signal comprising the first (In-phase) signal component 222 and the second (Quadrature) signal component 224 (FIG. 2), and to output a 2D (I/Q) digital control value 520 to the DPA module 230. Such a 2D digital control value 520 may comprise, for example two 13-bit control words, one 13-bit control word for each of the I and Q paths within the DPA module 230. Accordingly, each 13-bit control word may comprise a value ranging from, say, −4095 to +4095. As such, the digital signal processing module 210 may be arranged to output a 2D digital control value comprising one of 8191×8191 possible digital control word pair combinations; i.e. 67,092,481 possible digital control values in this example.

As previously mentioned, digital pre-distortion is required in order to compensate for RF impairments caused by, for example, PA non-linearities, IQ imbalance, AM/AM and AM/PM distortions and memory effects, etc. (depending on the type of architecture involved). Such RF impairments typically differ from device to device, and can also vary over time, for example due to changes in temperature and with the aging of components. As such, it is typically necessary to 'train' the pre-distortion functionality of each device in order to calibrate such pre-distortion functionality according to the specific requirements of that particular device. Such training is typically required prior to the RF transmitter circuitry being first used, and also may be periodically required in order to compensate for subsequent variations.

In order to be effective, such training of the pre-distortion functionality is required to be performed across the full profile for the DPA module 230. As identified above, such a profile may correspond to a large number of possible digital control values; 67,092,481 in the above example for a 13-bit DPA control word implementation. Performing calibration across such a large number of DPA control values would take a prohibitively long amount of time, requiring the RF transmitter circuitry to be unavailable for normal operation for prolonged periods of time during calibration of the pre-distortion functionality.

Thus, and in accordance with some example embodiments of the present invention, the digital signal processing module 210 is arranged to select, from a reduced set of DPA control values (i.e., in the illustrated example, within the content of the 2D LUT 540), a plurality of DPA control values based at least partly on the received digital input signal 510, perform interpolation of the plurality of selected DPA control values to determine a DPA control value from a non-reduced set of DPA control values representative of the received digital input signal 510, and output 520 to the DPA module 230 the determined DPA control value representative of the received digital input signal 510.

In this manner, and as described in greater detail below, because the received digital input signal 510 is used to select DPA control values from a reduced set of DPA control values, only the reduced set of DPA control values are required to be calibrated in order to perform training of the pre-distortion functionality across the full pre-distortion profile for the DPA module 230. Accordingly, the amount of time required to perform such calibration may be significantly reduced compared to the time required to calibrate the full, non-reduced set of DPA control values. Furthermore, by performing interpolation of the selected DPA control values in order to determine a DPA control value from the non-reduced set of DPA control values representative of the received digital input signal 510, the level of precision with which the DPA module 230 may be controlled is substantially maintained.

Figure 6:
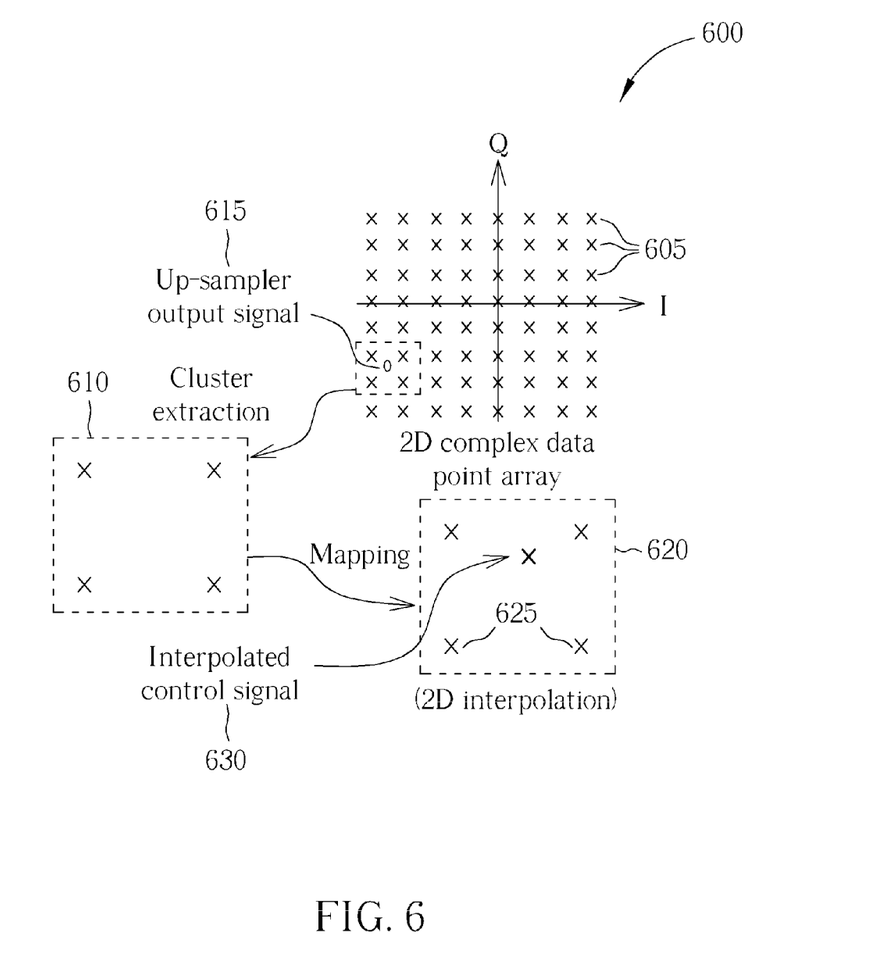
FIG. 6 illustrates a simplified example of mapping and interpolation within the digital signal processing module of FIG. 5.

In the example illustrated in FIG. 5, the digital signal processing module 210 comprises a cluster index search component (denoted as "Cluster Index Search") 530 arranged to receive the digital input signal 510 and identify, from within a set of DPA profile data points, a plurality of data points closest to the received digital input signal 510. For example, and as illustrated in FIG. 6, the cluster index search component 530 may be arranged to select a cluster 610 of data points 605 from within a 2D complex data point array 600. In particular for the illustrated example, the cluster index search component 530 may be arranged to select a cluster 610 of data points 605 located around a point 615 defined by the first (In-phase) signal component 222 and the second (Quadrature) signal component 224 (FIG. 2) of the received input signal 510. The cluster index search component 530 outputs 535 the selected cluster 610 of data points 605 to a 2D LUT (lookup table) 540.

The 2D LUT 540 is arranged to map DPA control values to the data points 605 within the 2D complex data point array. Accordingly, and as illustrated in FIG. 6, upon receipt of the cluster 610 of data points 605 output by the cluster search component 530, the 2D LUT 540 is arranged to retrieve a 'cluster' 620 of DPA control values 625 mapped to the received cluster 610 of data points 605. In this manner the cluster search component 530 and 2D LUT 540 are arranged to identify, from within the set (array) of DPA profile data points (i.e., in the illustrated example, within the content of 2D LUT saved in a memory) 600, a plurality of data points 605 closest to the received digital input signal 615, and to retrieve a cluster 620 of DPA control values 625 mapped to the identified data points 605. The 2D LUT 540 outputs the selected cluster 620 of DPA control values 625 to a 2D interpolation component (denoted as "2D Interpolation") 550. Significantly, the number of data points 605 within the 2D complex data point array is arranged to be less than the number of DPA control values for the DPA module 230. As such, the DPA control values mapped to the data points 605 comprise a reduced set of DPA control values.

The 2D interpolation component 550 receives the selected cluster 620 of DPA control values 625 output by the 2D LUT 540, comprising DPA control values from a reduced set of DPA control values (i.e., in the illustrated example, those mapped to the DPA profile data points 605). The 2D interpolation component 550 in the illustrated example is further arranged to receive the digital input signal 510, and perform interpolation, for example linear interpolation, Lagrange polynomial interpolation, spline interpolation, cubic interpolation, etc., of the cluster 620 of DPA control values 625 to determine a DPA control value 630 (FIG. 6) from a non-reduced set of DPA control values representative of the received digital input signal 615. The 2D interpolation component 550 then outputs, as the 2D (I/Q) digital control value 520 to the DPA module 230, the interpolated DPA control value 630.

Figure 7:
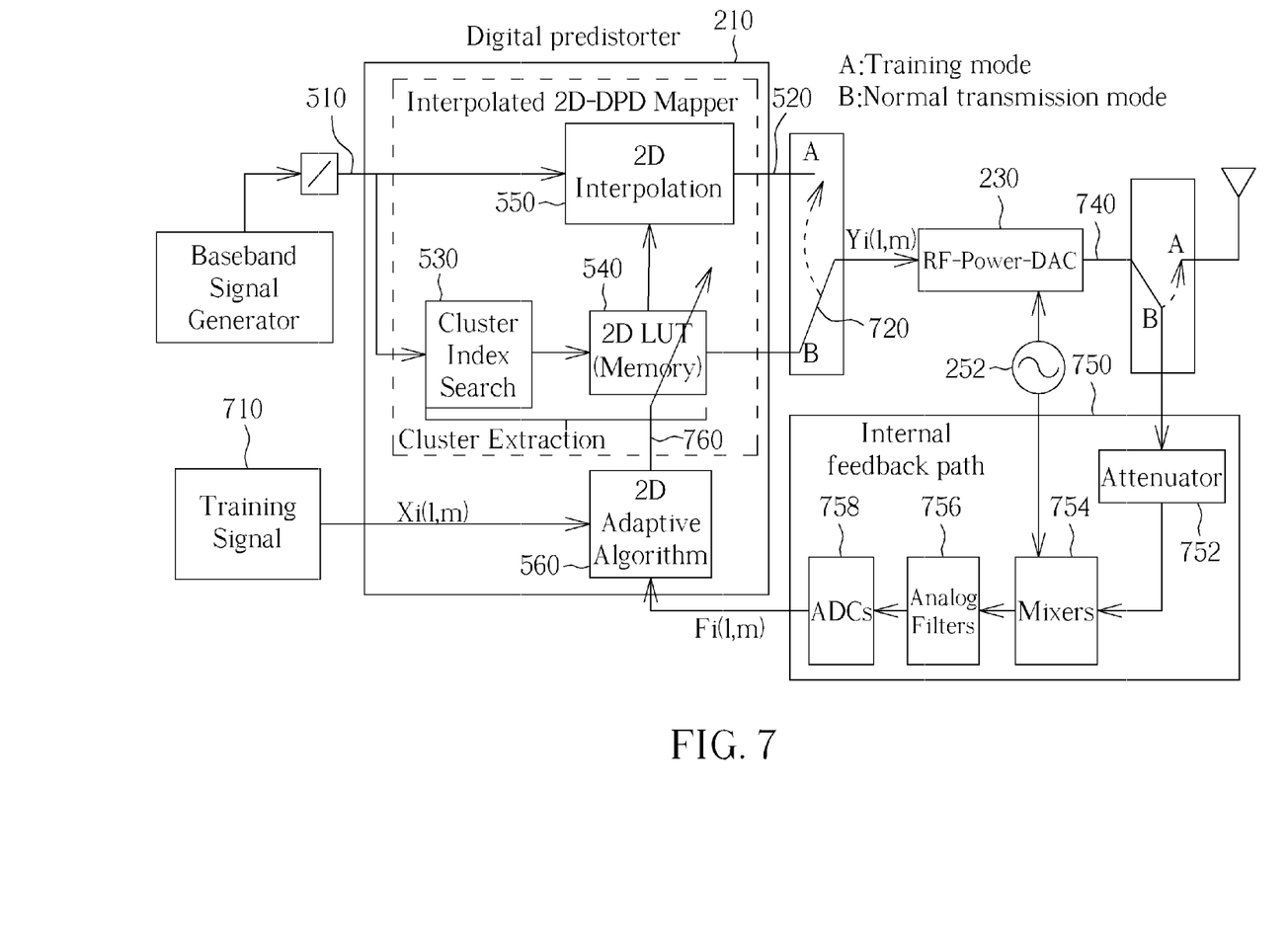

The digital signal processing module 210 further comprises an adaptive algorithm component (denoted as "2D Adaptive Algorithm") 560. The adaptive algorithm component 560 is arranged, when the signal processing module is configured to operate in a second, training mode, to perform calibration of the digital signal processing module 210. For example, and as illustrated in FIG. 7, when configured to operate in the first, transmission mode 'A', the digital signal processing module 210 is arranged to receive, as the digital input signal 510, a 2D up-sampled baseband signal, perform pre-distortion of the received digital input signal as described above, and to output as the 2D (I/Q) digital control value 520 to the DPA module 230, the interpolated DPA control value 630. Conversely, when the digital signal processing module 210 is configured to operate in the second, training mode 'B', the digital signal processing module 210 is arranged to receive a digital reference signal comprising a training signal $(X_i(l,m))$ 710, and to output to the DPA module 230 a DPA control value $(Y_i(l,m))$ 720 representative of the received digital training signal 710. The digital signal processing module 210 is further arranged to receive a feedback signal $(F_i(l,m))$ 730 from an output 740 of the DPA module 230, and to perform calibration thereof based at least partly on the received feedback signal 730. The digital signal processing module 210 may be dynamically configurable, for example via software, to switch between operating in the first and second modes.

In particular for the illustrated example, when the digital signal processing module 210 is operating in the second, training mode, the adaptive algorithm component 560 of the digital signal processing module 210 is arranged to receive the training signal 710, and to output 760 to the 2D LUT 540 one of the data points from the set of DPA profile data points representative of the training signal 710, and to which a DPA control value has been mapped. Upon receipt of the data point output 760 by the adaptive algorithm component 560, the 2D LUT 540 outputs the respective DPA control value 720 to the DPA module 230. Accordingly, when the digital signal processing module 210 is operating in this second, training mode, the digital signal processing module 210 is arranged to output a DPA control value from the reduced set of DPA control values (i.e. those mapped to the set of DPA profile data points 605 (FIG. 6)), in accordance with the received training signal 710.

In the illustrated example, the feedback signal 730 is provided via an internal feedback path 750 comprising an attenuator 752 arranged to receive and perform attenuation of the signal output 740 by the DPA module 230 to ensure that the mixers are not over-driven. Mixers 754 receive the attenuated feedback signal from the attenuator 752 and mix it with the carrier frequency signals 252 provided to the DPA module 230 to step down the attenuated feedback signal from a transmitted RF frequency to the baseband frequency. The feedback signal is then filtered by analogue filters 756 before analogue to digital converters (ADCs) 758 convert the analogue feedback signal into the digital feedback signal 730 received by the digital signal processing module 210. In this manner, the digital feedback signal 730 provided to the digital signal processing module 210 may comprise a format corresponding to that of the digital training signal 710.

In accordance with some example embodiments of the present invention, the digital training signal 710 may comprise a value representative of a data point within the set of DPA profile data points to which the reduced set of DPA control values are mapped. Furthermore, the adaptive algorithm component 560 of the digital signal processing module 210 may perform calibration thereof in the second, training mode, by updating a DPA control value mapped to the digital training signal data point based at least partly on the received feedback signal 730, for example in an iterative process, such that a value of the received feedback signal 730 substantially converges with the data point value of the training signal (a known reference signal) 710. For example, the adaptive algorithm component 560 may be arranged to perform a comparison of the digital training signal (a known reference signal) 710 and the feedback signal 730, and to update the respective DPA control value mapped to the training signal data point value based on said comparison.

Figure 8:
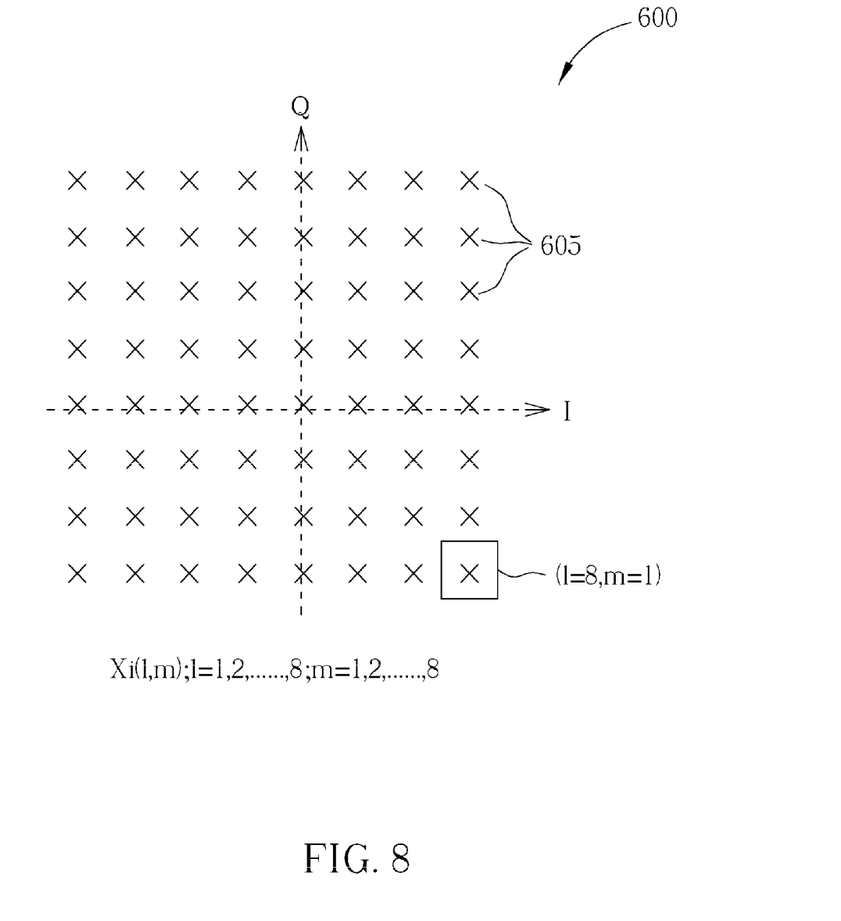
FIG. 8 illustrates a simplified example of a training signal for the digital signal processing module of FIG. 7.

For example, and as illustrated in FIG. 8, the training signal 710 may comprise a value representative of a data point 605 within the 2D complex data point array 600 to which DPA control values are mapped within the 2D LUT 540. Accordingly, the training signal 710 may be denoted as $X_i(l,m)$; l=1, 2, ..., L; m=1, 2, ..., M where l and m are the table indexes for the I and Q components of the training signal respectively, and L×M is the 2D complex data point array size. Similarly, the DPA control value 720 output by the LUT may be denoted as $Y_i(l,m)$. Without loss of generality, it may be assumed that the feedback gain is equal to unity. Accordingly, calibration scheme may be implemented on a 2D gradient search to achieve an appropriate mapping of a DPA control value to the data point 605 within the 2D complex data point array 600 as follows:

$$Y_{i+1}(l,m)=Y_i(l,m)+\mu E_i(l,m), i=0, 1, \ldots, N-1 \quad \text{Eq. 1}$$

where i denotes the i-th iteration, $\mu$ is a step size (real value), $E_i(l,m)$ is a complex error value, and N is the number of total iterations.

Next, let $X_i(l,m)=x_i^{(I)}(l,m)+jx_i^{(Q)}(l,m)$ denote the training signal associated with the table contents for index (l,m) at iteration i, where $x_i^{(I)}(l,m) \in \{-4095, \ldots, 0, \ldots, 4095\}$ and $x_i^{(Q)}(l,m) \in \{-4095, \ldots, 0, \ldots, 4095\}$ are 13-bit digital input signal components. The output 720 of 2D LUT 540 $Y_i(l,m)$ (i.e. the DPA control values) are output to the DPA module 230. In this manner, the feedback signal 730 $F_i(l,m)$), which is directly derived from the output 740 of the DPA module 230, corresponds directly to the output 720 of 2D LUT 540 $Y_i(l,m)$ (i.e. with no interpolation being performed). From the feedback signal $F_i(l,m)$ and known training signal $X_i(l,m)$, the complex error value may be derived as follows:

$$E_i(l,m)=GX_i(l,m)-F_i(l,m), i=0, 1, \ldots, N-1 \quad \text{Eq. 2}$$

where G is the desired linear gain. Thus, after N iterations, the 2D LUT may be updated and calibrated to obtain:

$$Y^{(o)}(l,m)=Y_N(l,m) \quad \text{Eq. 3}$$

where the reduced set of DPA control values mapped to the DPA data points 605 within the 2D complex data point array 600 apply appropriate pre-distortion to received signals in accordance with the specific RF impairments of the DPA module 230.

Significantly, because the received digital input signal 510 is used to select DPA control values from a reduced set of DPA control values when the digital signal processing module 210 is operating in the first, transmission mode, only the reduced set of DPA control values (i.e., in the illustrated example, within the content of the 2D LUT 540) are required to be calibrated in order to perform training of the pre-distortion functionality across the full pre-distortion profile for the DPA module 230. Accordingly, the amount of time required to perform such calibration may be significantly reduced compared to the time required to calibrate the full, non-reduced set of DPA control values. For example, if it were necessary to perform calibration of a full sized 8191×8191 LUT for a 2D 13-bit control value, it would be necessary to calibrate 67,092,481 possible digital control values. In contrast, by utilising a reduced set of DPA control values, a LUT of a reduced size, for example a 64×64 LUT, it would only be necessary to calibrate 4096 possible digital control values. Thus, a significant saving in calibration time and memory requirements may be made.

As previously mentioned, when the digital signal processing module 210 is configured to operate in the first, transmission mode, the digital signal processing module 210 of the illustrated example applies 2D digital pre-distortion to the received digital input signal 510 in accordance with the calibrated reduced set of DPA control values and subsequent interpolation of a selected cluster of DPA control values to which the received digital input signal 510 is mapped. The particular architecture of the DPA module 230 in the illustrated example suffers from IQ mismatch and PA non-linearity in a similar manner to conventional linear architectures. Conventionally, IQ mismatch and PA non-linearity are compensated for separately, for example using a single-tone signal to calibrate IQ mismatch before performing pre-distortion calibration for compensating for the PA non-linearity. However, in the illustrated example, the IQ mismatch and the PA non-linearity may be jointly compensated for through asymmetric input-output mapping achieved during the calibration process, simplifying and improving the efficiency of the pre-distortion functionality.

Furthermore, for some calibrations of conventional PAs, the AM/AM and AM/PM are separately calibrated (AM/AM calibration followed by AM/PM calibration). The conventional AM/AM calibration is based on a reference signal with different amplitudes and baseband distorted signal from internal feedback path. In contrast, for the illustrated example of the present invention, the 2D LUT 540 may be calibrated as described above such that the relation of the LUT input (training signal) and the observed baseband signal from internal feedback path is linearly associated with the respective amplitudes. Similarly, in the conventional AM/PM calibration the same concept is applied as for the AM/AM calibration. Whereas for the illustrated example of the present invention, training signals with different amplitudes in combination with the baseband distorted signals in phase from the internal feedback path may be used to calibrate all the points of the LUT in the same calibration stage.

Figure 9:
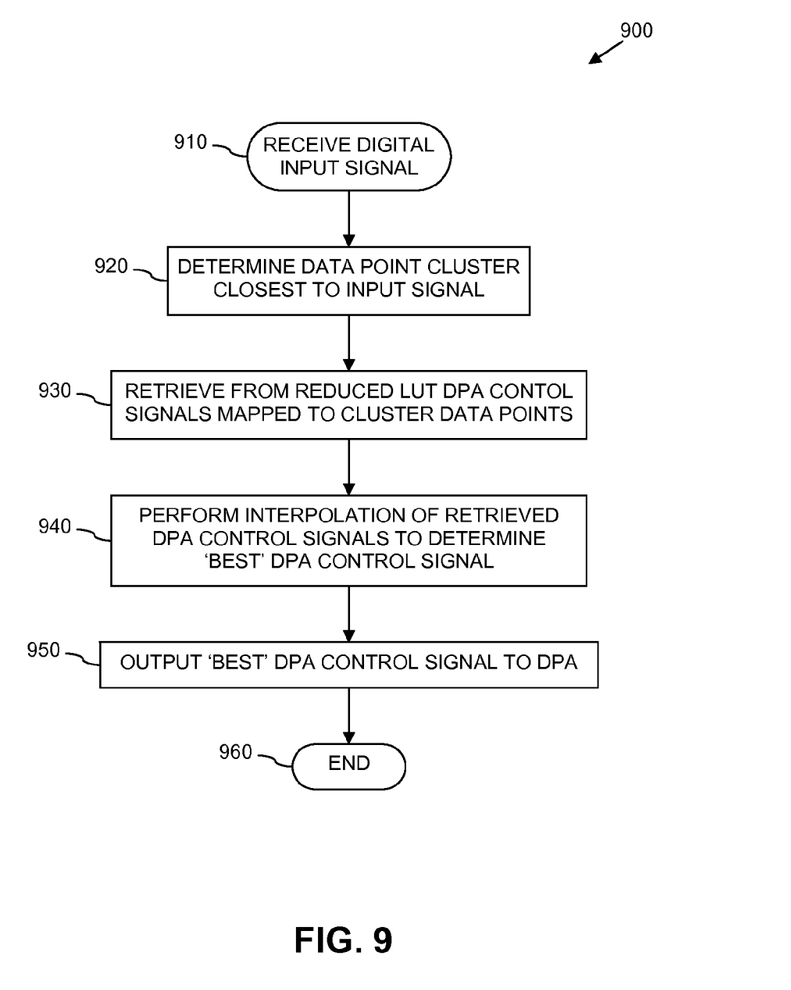
FIGS. 9 and 10 illustrate simplified flowcharts of parts of a method of performing digital pre-distortion of a signal for transmission over an RF interface.
Figure 10:
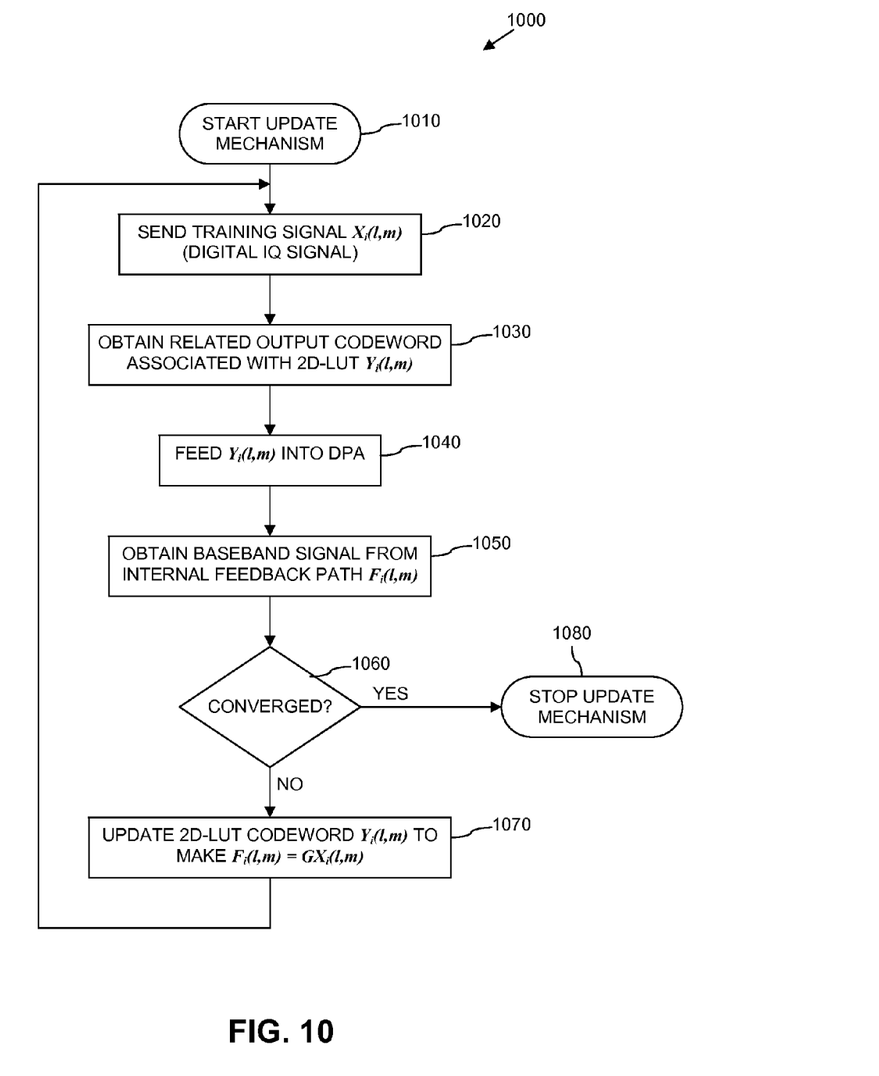

Referring now to FIGS. 9 and 10, there are illustrated simplified flowcharts 900 and 1000 of parts of a method of performing digital pre-distortion of a signal for transmission over an RF interface. A first part of the method, during a first, transmission mode of operation, starts at 910 with the receipt of a digital input signal, such as the up-sampled digital signal 510 illustrated in FIGS. 5 and 7. Next, at 920, a cluster of data points closest to the input signal from within a DPA profile and are determined. DPA control values, from a reduced set of DPA control values, mapped to the determined cluster of data points are then retrieved from a LUT, at 930. In this manner, a plurality of DPA control values are selected from a reduced set of DPA control values. based at least partly on the received digital input signal. Interpolation of the plurality of selected DPA control values is then performed at 940 to determine a DPA control value from a non-reduced set of DPA control values representative of the received digital input signal. The determine a DPA control value from the non-reduced set of DPA control values representative of the received digital input signal is then output, at 950, to a DPA module. The first part of the method then ends at 960.

A second part of the method, during a second, training mode of operation, starts at 1010 with the starting of an update mechanism for each point in 2D LUT 540. Next, at 1020, the method moves on to 1020, where a training signal $X_i(l,m)$ comprising in the illustrated example a digital IQ signal. A corresponding DPA control word $Y_i(l,m)$ mapped to the received training signal value within the LUT is then retrieved, at 1030, and output to the DPA module, at 1040. A feedback signal $F_i(l,m)$ for the retrieved DPA control word is then obtained from an output of the DPA module, at 1050. It is then determined, at 1060, whether the training signal $X_i(l,m)$ with a linear gain G and the feedback signal $F_i(l,m)$ for the retrieved DPA control word mapped thereto are substantially equal. If not, the method moves on to 1070, where the DPA control value mapped to the value of the training signal $X_i(l,m)$ is updated in order to make the feedback signal $F_i(l,m)$ equal to the value of the training signal $X_i(l,m)$ with a linear gain G. The method then loops back to 1040. Referring back to 1060, if the training signal $X_i(l,m)$ with a linear gain G and the feedback signal $F_i(l,m)$ for the retrieved DPA control word mapped thereto are substantially equal, the method moves on to 1080, where the update mechanism is stopped.

The illustrated example embodiments of the present invention have, for the most part, been implemented using electronic components and circuits known to those skilled in the art. Accordingly, details have not been explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms 'assert' or 'set' and 'negate' (or 'de-assert' or 'clear') are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps than those listed in a claim. Furthermore, the terms 'a' or 'an', as used herein, are defined as one or more than one. Also, the use of introductory phrases such as 'at least one' and 'one or more' in the claims should not be construed to imply that the introduction of another claim element by the indefinite articles 'a' or 'an', limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. A radio frequency (RF) transmitter architecture comprising at least one digital signal processing unit configured to operate in at least a first mode, wherein the at least one digital signal processing unit, when operating in the first mode, is configured to:
    receive a digital input signal;
    select a portion, not all, of digital power amplifier (DPA) control values from a reduced set of DPA control values based at least partly on the received digital input signal;
    refer to the received digital input signal to perform interpolation on the selected portion of DPA control values to determine a DPA control value from a non-reduced set of DPA control values representative of the received digital input signal; and
    output the determined DPA control value representative of the received digital input signal to at least one DPA component whereby the determined DPA control value controls the at least one DPA component.

2. The RF transmitter architecture of claim 1 wherein the at least one digital signal processing unit, when operating in the first mode, is further configured to:
    identify, from within a set of DPA profile data points to which the reduced set of DPA control values have been mapped, a plurality of data points closest to the received digital input signal; and
    select a plurality of DPA control values mapped to the identified data points with which to perform interpolation.

3. The RF transmitter architecture of claim 2 wherein the at least one digital signal processing unit is further configured to retrieve the DPA control values mapped to the identified data points from within a lookup table.

4. The RF transmitter architecture of claim 2 wherein the digital input signal comprises a two-dimensional signal and the at least one digital signal processing unit, when operating in the first mode, is further configured to:
    identify, from within a set of data points for a two-dimensional data profile to which the reduced set of DPA control values have been mapped, a two-dimensional cluster of data points closest to the received digital input signal; and
    select a plurality of DPA control values mapped to the identified data points with which to perform interpolation.

5. The RF transmitter architecture of claim 1 wherein the received digital control signal comprises an in-phase/quadrature (I/Q) signal.

6. The RF transmitter architecture of claim 1 wherein the received digital control signal comprises an up-sampled baseband signal.

7. The RF transmitter architecture of claim 1 wherein the at least one digital signal processing unit is further configured to perform digital pre-distortion of the received digital input signal, when operating in the first mode.

8. The RF transmitter architecture of claim 7 wherein the at least one digital signal processing unit, when operating in the first mode, is further configured to perform digital pre-distortion of the received digital input signal to compensate for at least one of:
    DPA non-linearity;
    in-phase/quadrature path imbalance; and
    DPA memory effect.

9. A wireless communication unit comprising the RF transmitter architecture according to claim 1.

10. An integrated circuit device comprising at least one digital signal processing unit configured to operate in at least a first mode, wherein the at least one digital signal processing unit, when operating in the first mode, is configured to:

receive a digital reference signal;

select a portion, not all, of digital power amplifier (DPA) control values from a reduced set of DPA control values based at least partly on the received digital reference signal;

refer to the received digital input signal to perform interpolation on the selected portion of DPA control values to determine a DPA control value from a non-reduced set of DPA control values representative of the received digital reference signal; and     output the determined DPA control value representative of the received digital reference signal to at least one DPA component whereby the determined DPA control value controls the at least one DPA component.

11. A method of performing digital pre-distortion of a signal for transmission over a radio frequency (RF) interface, the method comprising:

receiving a digital input signal;

selecting a portion, not all, of digital power amplifier (DPA) control values from a reduced set of DPA control values based at least partly on the received digital input signal;

referring to the received digital input signal to perform interpolation on the plurality of selected portion of DPA control values to determine a DPA control value from a non-reduced set of DPA control values representative of the received digital input signal; and     outputting the determined DPA control value representative of the received digital input signal to at least one DPA component whereby the determined DPA control value controls the at least one DPA component.

\* \* \* \* \*